United States Patent
Pranatharthiharan et al.

(10) Patent No.: US 10,256,239 B2
(45) Date of Patent: Apr. 9, 2019

(54) SPACER FORMATION PREVENTING GATE BENDING

(71) Applicant: International Business Machines Corporation, Armonk, NY (US)

(72) Inventors: Balasubramanian Pranatharthiharan, Watervliet, NY (US); Eric R. Miller, Schenectady, NY (US); Soon-Cheon Seo, Glenmont, NY (US); John R. Sporre, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/296,651

(22) Filed: Oct. 18, 2016

(65) Prior Publication Data

US 2018/0108660 A1    Apr. 19, 2018

(51) Int. Cl.
| | |
|---|---|
| H01L 27/092 | (2006.01) |
| H01L 21/8238 | (2006.01) |
| H01L 21/02 | (2006.01) |
| H01L 29/66 | (2006.01) |
| H01L 27/02 | (2006.01) |
| H01L 21/311 | (2006.01) |

(52) U.S. Cl.
CPC ...... *H01L 27/0924* (2013.01); *H01L 21/0217* (2013.01); *H01L 21/02167* (2013.01); *H01L 21/31111* (2013.01); *H01L 21/823814* (2013.01); *H01L 21/823821* (2013.01); *H01L 21/823864* (2013.01); *H01L 27/0207* (2013.01); *H01L 29/66636* (2013.01)

(58) Field of Classification Search
CPC ...................... H01L 21/02167; H01L 27/0927
USPC ......................................................... 257/401
See application file for complete search history.

(56) References Cited

U.S. PATENT DOCUMENTS

| | | |
|---|---|---|
| 6,632,745 B1 | 10/2003 | Yap et al. |
| 6,693,013 B2 | 2/2004 | Bae et al. |
| 7,488,659 B2 | 2/2009 | Dyer |
| 7,495,280 B2 | 2/2009 | Lo |

(Continued)

OTHER PUBLICATIONS

P. Morin et al., "Tensile Contact Etch Stop Silicon Nitride for NMOS Performance Enhancement: Influence of the Film Morphology," ECS Proceeding, 2005, pp. 253-263.

(Continued)

*Primary Examiner* — Tucker J Wright
*Assistant Examiner* — Warren H Kilpatrick
(74) *Attorney, Agent, or Firm* — Vazken Alexanian; Ryan, Mason & Lewis, LLP

(57) ABSTRACT

A method of forming a semiconductor structure includes depositing a spacer material over a top surface of a substrate and two or more spaced-apart gates formed on the top surface of the substrate. The method also includes depositing a sacrificial liner over the spacer material and etching the sacrificial liner and the spacer material to expose portions of the top surface of the substrate between the two or more spaced-apart gates. The method further includes removing the sacrificial liner such that remaining spacer material forms two or more spacers between the two or more spaced-apart gates, each of the spacers including a first portion proximate the top surface of the substrate having a first width and a second portion above the first portion with a second width smaller than the first width.

20 Claims, 22 Drawing Sheets

(56) References Cited

U.S. PATENT DOCUMENTS

| | | | |
|---|---|---|---|
| 7,871,869 B2 | 1/2011 | Cartier et al. | |
| 8,765,546 B1 * | 7/2014 | Hung | H01L 21/823431 |
| | | | 257/190 |
| 8,937,369 B2 | 1/2015 | Liu et al. | |
| 9,252,018 B2 | 2/2016 | Mo et al. | |
| 9,508,604 B1 * | 11/2016 | Sung | H01L 21/823821 |
| 2007/0196991 A1 | 8/2007 | Nandakumar et al. | |
| 2015/0263122 A1 | 9/2015 | Hsiao et al. | |
| 2016/0343858 A1 * | 11/2016 | Kim | H01L 29/7848 |
| 2017/0133509 A1 | 5/2017 | Hsiao et al. | |
| 2017/0207338 A1 | 7/2017 | Chiu et al. | |

OTHER PUBLICATIONS

M.J. Hÿtch et al., "Dark-Field Electron Holography for the Mapping of Strain in Nanostructures: Correcting Artefacts and Aberrations," Electron Microscopy and Analysis Group Conference (EMAG), 2009, 6 pages.

U.S. Appl. No. 15/015,512, filed in the name of M.A. Bergendahl et al. on Feb. 4, 2016 and entitled "Single Spacer for Complementary Metal Oxide Semiconductor Process Flow.".

\* cited by examiner

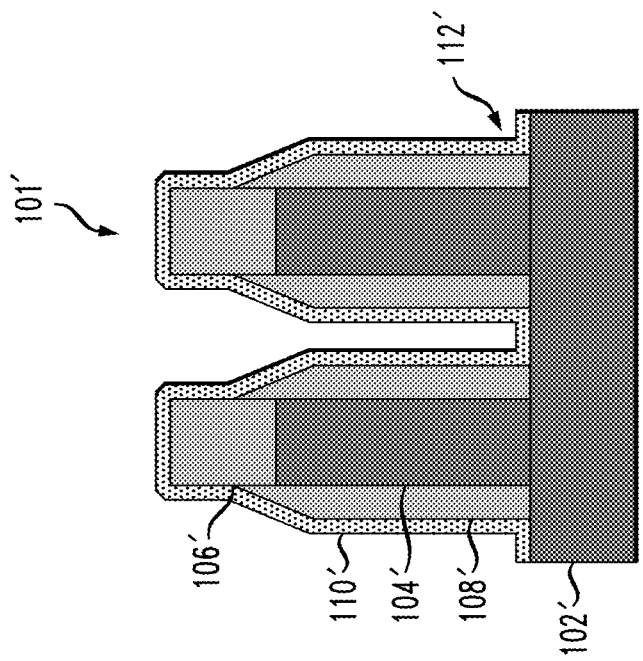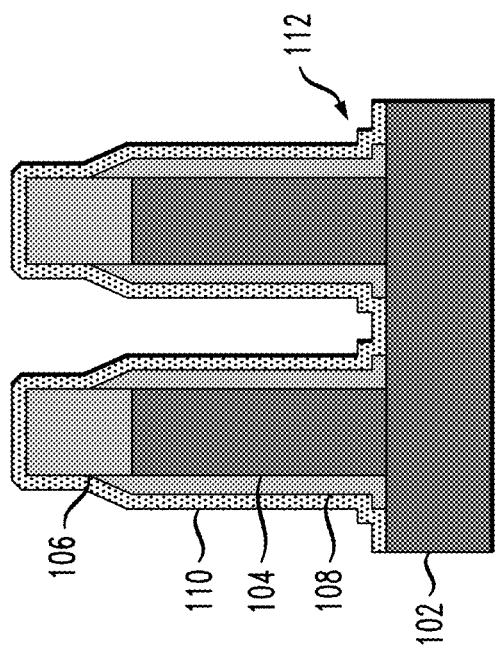

200

300

400

500

900

1000

1100

1600

1800

1900

2000

2100

2200

SPACER FORMATION PREVENTING GATE BENDING

BACKGROUND

The present application relates to semiconductors, and more specifically, to techniques for forming semiconductor structures. Various types of field-effect transistor (FET) devices may be used in semiconductor structures, integrated circuits and other electronic devices. Fin FETs (FinFETs) are a type of FET device, where fins are patterned on a substrate.

SUMMARY

Embodiments of the invention provide techniques for spacer formation to prevent gate bending.

For example, in one embodiment a method of forming a semiconductor structure comprises depositing a spacer material over a top surface of a substrate and two or more spaced-apart gates formed on the top surface of the substrate. The method also comprises depositing a sacrificial liner over the spacer material and etching the sacrificial liner and the spacer material to expose portions of the top surface of the substrate between the two or more spaced-apart gates. The method further comprises removing the sacrificial liner such that remaining spacer material forms two or more spacers between the two or more spaced-apart gates, each of the spacers comprising a first portion proximate the top surface of the substrate having a first width and a second portion above the first portion with a second width smaller than the first width.

In another embodiment, a semiconductor structure comprises a finFET structure comprising two or more spaced-apart gates formed on a fin substrate and two or more spacers formed between the two or more spaced-apart gates, wherein each of the spacers comprises a first portion proximate a top surface of the fin substrate having a first width and a second portion above the first portion with a second width smaller than the first width. A first distance between the first portions of pairs of spacers between adjoining pairs of the spaced-apart gates and a second distance between the second portions of the pairs of spacers between the adjoining pairs of the spaced-apart gates are substantially the same for each pair of spacers.

In another embodiment, an integrated circuit comprises a finFET structure comprising two or more spaced-apart gates formed on a fin substrate and two or more spacers formed between the two or more spaced-apart gates, wherein each of the spacers comprises a first portion proximate a top surface of the fin substrate having a first width and a second portion above the first portion with a second width smaller than the first width. A first distance between the first portions of pairs of spacers between adjoining pairs of the spaced-apart gates and a second distance between the second portions of the pairs of spacers between the adjoining pairs of the spaced-apart gates are substantially the same for each pair of spacers.

BRIEF DESCRIPTION OF THE DRAWINGS

FIGS. 1A and 1B depict side cross-sectional views of semiconductor structures, according to an embodiment of the invention.

DETAILED DESCRIPTION

Figure 2:
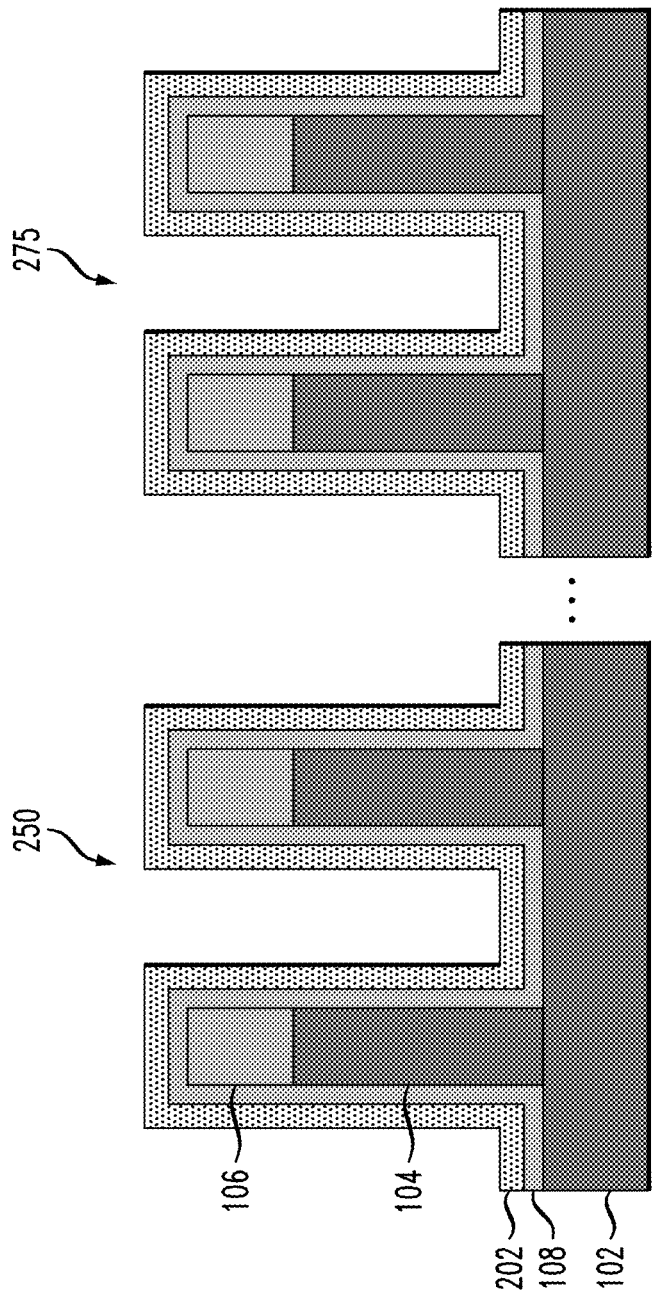
FIG. 2 depicts a side cross-sectional view of bilayer deposition in a semiconductor structure, according to an embodiment of the invention.

Illustrative embodiments of the invention may be described herein in the context of illustrative methods for forming spacers to prevent gate bending, along with illustrative apparatus, systems and devices having spacers formed using such methods. However, it is to be understood that embodiments of the invention are not limited to the illustrative methods, apparatus, systems and devices but instead are more broadly applicable to other suitable methods, apparatus, systems and devices.

In semiconductor structures such as fin field-effect transistors (finFETs), it is desired to form smaller structures. As dimensions shrink, the formation of such semiconductor structures presents various challenges. For example, in both n-channel field-effect transistor (NFET) and p-channel field-effect transistor (PFET) regions of a finFET structure, it is desired to have very small gate pitch, such as gate pitch smaller than 64 nanometers (nm) contacted poly pitch (CPP). Gate pitch smaller than 64 CPP, however, generally requires equal spacer thickness for both NFET and PFET. Tight gate pitch can cause gate bending issues, which result in inefficient spacer reactive-ion etching (ME) and unequal epitaxial growth from source to drain. Gate bending may be induced by the stress of spacers, which are preferably low-K materials such as materials having a dielectric constant K<6. Silicon boron carbon nitride (SiBCN) is an example of such a low-K material. Other low-K materials include but are not limited to silicon oxycarbonnitride (SiOCN), SiNC, silicon dioxide (SiO$_2$) and SiCOH. Gate bending may also be caused due to the high aspect ratio (AR) of gates. For example, gates with an AR of 11:1 or greater may be susceptible to gate bending. In addition, capillary forces between gates with small spacers, such as spacers less than 15 nm, can contribute to gate bending.

To address issues with gate bending, some embodiments utilize a thinner spacer for the upper portion of a gate. The target spacer thickness for the lower portion of the gate near the source/drain fin may thus be L-shaped. Such spacers are referred to herein as L-shaped spacers.

Substantial gate deformation may be observed after spacer deposition. For example, buckling may be induced by the SiCBN tension and gate AR. Buckling refers to the loss of stability of a component under loading. Above a certain load, a column such as a gate can be subjected to large or catastrophic deformation referred to as buckling. An Euler model for calculating the critical stress or force for buckling may be used:

$$\sigma_{Euler} = \frac{F_{Euler}}{A} = \frac{k\pi^2 E}{(L/r)^2}$$

where E is the modulus, L/r is a slenderness factor or AR, r is the radius of gyration and k is a constant that depends on the restraints of the two ends of the column.

Sidewall spacers in semiconductor structure may be under tensions, with resultant compression on the gate surrounded by such spacers. As the AR of a gate may be high, gates in such semiconductor structures are subject to buckling. The above Euler model for calculating the critical stress or force for buckling may be modeled as $$\sigma_{Euler} = k\frac{\pi^2}{(L/r)^2}E_g$$

where $E_g$ is the gate modulus. The load depends on the spacer stress and on the spacer critical dimension (CD) versus total CD. Assuming that the modulus of the spacer $E_{spacer} \sim E_g$, the above model may be simplified as $$\sigma_{Euler} \approx -\frac{2CD_{spacer}}{2CD_{spacer} + L_g}\sigma_{spacer}$$

where $L_g$ is the width of the gate. Thus, the buckling load factor (BLF) of the gate may be computed as $$BLF \propto \frac{(2CD_{spacer} + L_g)^3}{2CD_{spacer}h_g^2\sigma_{spacer}}E_g$$

where $h_g$ is the height of the gate. To increase BLF, one can increase $L_g$ and $E_g$, and/or reduce $h_g$ and $\sigma_{spacer}$. $CD_{spacer}$ is specific, as it varies during spacer deposition. In a first stage of spacer deposition, the BLF decreases with growth and buckling propensity increases as the load increases. In the second stage of spacer deposition, as the spacer thickness increases the slenderness ration is decreased resulting in improved mechanical properties and BLF. However, even if improvement is found at the end of the spacer deposition process, buckling might occur before the spacer deposition process is complete and thus optimizing for the spacer CD is not efficient, as other parameters should be optimized for the worst $CD_{spacer}$ values.

As mentioned above, gate buckling or bending may be mitigated through the use of L-shaped spacers. Gate bending issues at 44 CPP, for example, may be induced by the stress of the spacer material, high AR gates and capillary forces between nano-scale distances between gates.

FIG. 1A shows a side cross-sectional view 100 of the space between gates in a structure 101, and FIG. 1B shows a side cross-sectional view 150 of the space between gates in a structure 101'. Structure 101 includes a source/drain 102 with gates 104 formed thereon. Similarly, structure 101' includes a source/drain 102' with gates 104' formed thereon. The source/drain 102, 102' and gates 104, 104' may be formed of silicon (Si), doped poly, full metal gates for a gate first scheme, dummy gates using Si, carbon (C), silicon nitride (SiN) for gate-last replacement gate schemes, etc. in some embodiments. It is to be appreciated that although FIG. 1 shows structure 101 and 101' each with two gates 104, 104', this is merely an example and not a requirement. Structures may include more or fewer than two gates as desired. Each of the gates 104, 104' may have a width of approximately 15 nm in some embodiments. The spacing between the gates 104, 104' may be approximately 44 nm in some embodiments. The spacing between the gates 104, 104' is measured from a first edge of one of the gates to a corresponding first edge in an adjoining gate.

Structure 101 includes gate caps or hard masks 106 formed over the gates 104. Structure 101' similarly includes gate caps 106' formed over the gates 104'. The gate caps 106, 106' may be formed of SiN, SiBCN, combinations of SiN/SiO$_2$ depending on patterning and integration schemes which are used.

Spacers 108 are formed on sidewalls of the gates 104 and portions of the gate caps 106 in structure 101. Similarly, spacers 108' are formed on sidewalls of the gates 104' and portions of the gate caps 106' in structure 101'. Capping layer 110 is formed surrounding the spacers 108, gate caps 106 and source/drain 102 as shown in structure 101. Similarly, capping layer 110' is formed surrounding the spacers 108', gate caps 106' and source/drain 102' as shown in structure 101'. The spacers 108, 108' may be formed of a material allowing the capping layers 110, 110' to be removed selective to the spacers 108, 108'. In some embodiments, the spacers 108, 108' are formed of SiBCN while capping layers 110, 110' are formed of silicon nitride (SiN) or silicon dioxide (SiO$_2$). In other embodiments, various other materials may be used including but not limited to SiBCN, SiCON, SiCOH, SiO2, other low-K materials, etc. SiBCN is preferred in some embodiments since it has a very high HF wet etch resistance compared with other material types. Various other material combinations may be used in other embodiments as long as one can have the sacrificial layers easily removed without attacking the main L-shape spacer.

The thickness of spacers 108 in structure 101 may be approximately 5.5 nm through most of the sidewalls, with the L-shaped region 112 shown 2 nm wider. Thus, the bottom of spacers 108 is approximately 7.5 nm wide, with the remaining portion of the spacers 108 approximately 5.5 nm to provide the L-shaped spacer. The capping layer 110 may be approximately 2-3 nm thick. In some embodiments, the capping layer 110 is originally formed as 2 nm SiO$_2$ and then replaced with 3 nm thick SiN. As the spacers 108 are L-shaped as shown in region 112, the distance between the spacers can be approximately 14 nm in some embodiments assuming a 3 nm thickness of capping layer 110 on either side. In comparison, the structure 101' does not utilize L-shaped spacers as illustrated in region 112'. Thus, the distance between spacers 108' can be approximately 8 nm assuming a 3 mm thickness of the capping layer 110' on either side. It is important to note that these dimensions are provided by way of example only, and that embodiments are not limited solely to the specific examples given.

Use of the L-shaped spacers 108 thus provides for wider space between gates 104, as compared with the use of non-L-shaped spacers 108'. Since there is very limited space between gates 104 to deposit SiN epitaxial capping layer 110, the use of the L-shaped spacers 108 provides various advantages. The 6-14 nm space between gates 104 for a 2 nm SiN capping layer 110 for 44 CPP due to the gate CD and pitch walk variation. Thus, processing steps such as organic polymer layer (OPL) etching and stripping may not be cleaned effectively without the use of L-shaped spacers.

Techniques for forming equal-spaced L-shaped spacers will now be described with respect to FIGS. 2-22. Equal spacing can be important for the formation of contacts. Without equal spacing, for example, the resulting structure may have smaller contacts in an NFET or PFET region leading to various inefficiencies. Benefits of using equal spacers include, but are not limited to, having equal spacer thickness for both NFET and PFET regions so that contact openings are the same. It is to be appreciated that the use of the term "equal" in conjunction with equal spacer thickness does not require that the spacer thickness be exactly the same, but only within some threshold distance such that the spacer thickness is substantially the same. For example, due to process variations the exact thickness of different spacers may vary slightly, such as within 1 nm, but still be considered substantially the same or equal in thickness.

FIG. 2 shows a side cross-sectional view of bilayer deposition of spacers 108 and sacrificial liner 202 over the source/drain 102, gates 104 and gate caps 106. The bilayer deposition of spacers 108 and sacrificial liner 202 may be performed using atomic layer deposition (ALD), chemical vapor deposition (CVD) or other techniques which provide very conformal deposition around the gates 104.

The sacrificial liner 202 may be SiN or an oxide in some embodiments. FIG. 2 shows a first portion 250 and a second portion 275 of a structure. As will be described in further detail below, the first portion 250 and second portion 275 represent PFET and NFET regions of the resulting structure. The regions 250 and 275 are separated by an ellipsis . . . to denote that there may be more than two gates 104 in each of the regions 250 and 275—the regions 250 and 275 are not separate structures but are part of the same larger structure. The regions 250 and 275 depicted in FIG. 2 are not explicitly labelled in FIGS. 3-22, and are also referred to in the description below as first and second portions of the structure, respectively, or as PFET and NFET regions of the structure, respectively.

Figure 3:
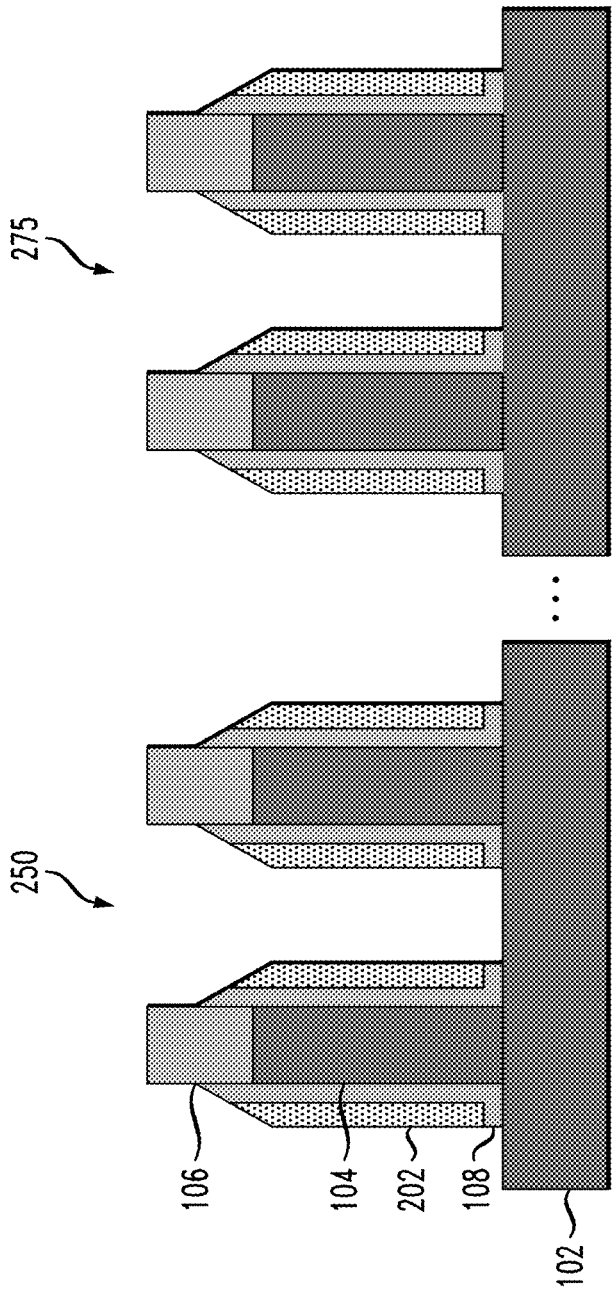
FIG. 3 depicts a side-cross sectional view of the FIG. 2 structure following a spacer etch, according to an embodiment of the present invention.

FIG. 3 shows a side cross-sectional view 300 of the FIG. 2 structure following a spacer etch, wherein portions of the spacers 108 and the sacrificial liner 202 are removed as illustrated.

The spacer etch may be performed utilizing ME, which may be tuned to etch both the spacers 108 and the oxide 202 in some embodiments.

As shown in FIG. 3, only portions of the spacers 108 are removed such that the gates 104 are covered. The spacers 108 should not be pulled down below the gates 104. The gate caps 106 and spacer 108 should cover the gates 104 fully to prevent rogue epitaxial nodules from growing from the gates in later processing steps.

Figure 4:
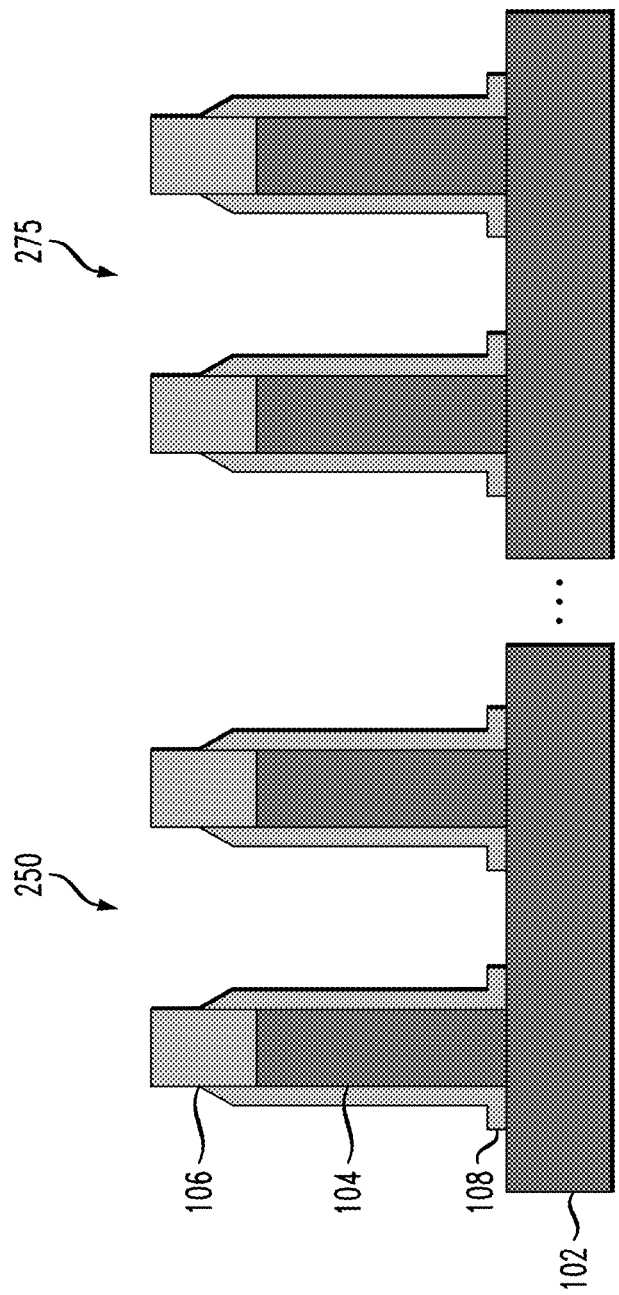
FIG. 4 depicts a side cross-sectional view of the FIG. 3 structure following etching of a sacrificial liner and formation of L-shape spacers, according to an embodiment of the present invention.

FIG. 4 shows a side cross-sectional view 400 of the FIG. 3 structure following etching of the sacrificial liner 202 to form the L-shaped spacers 108. Etching of the sacrificial liner 202 may utilize HF-based wet etching chemistry or remote plasma etching in some embodiments. These techniques provide good etch selectivity to remove the sacrificial liner 202 selective to the main L-shaped spacers 108.

Figure 5:
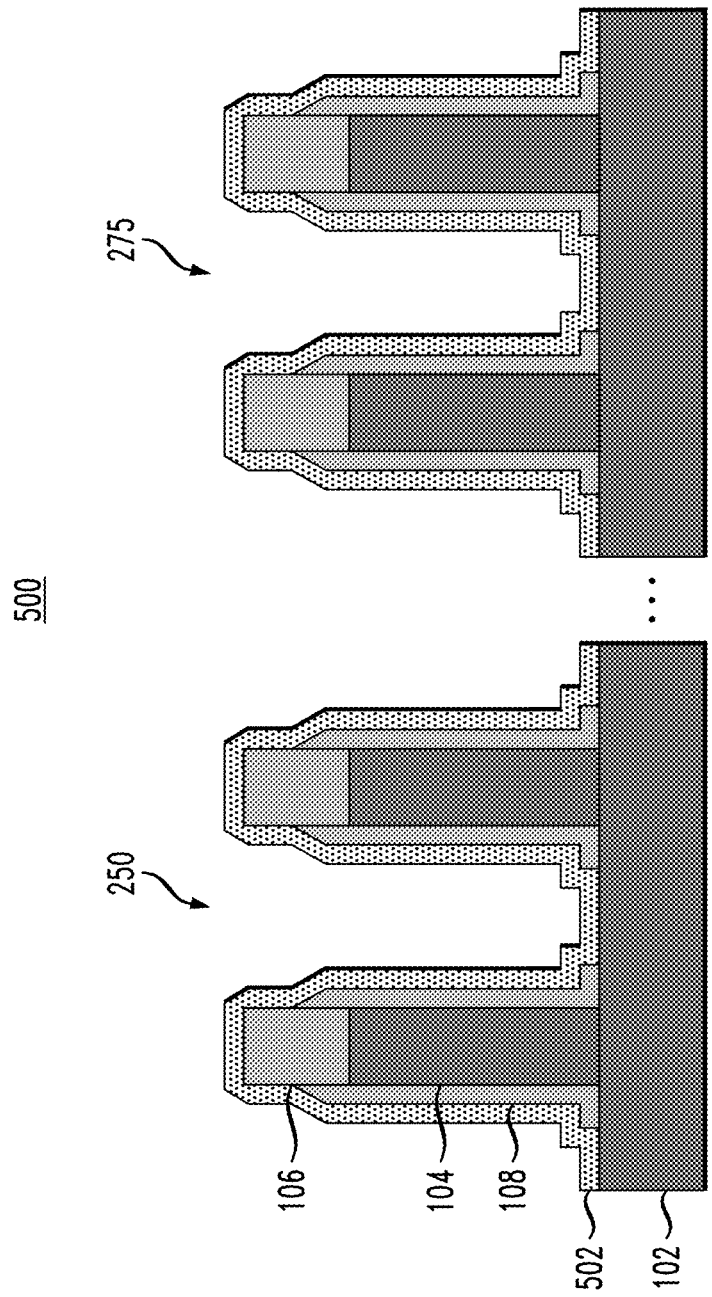
FIG. 5 depicts a side cross-sectional view of the FIG. 4 structure following deposition of a sacrificial capping layer, according to an embodiment of the present invention.

FIG. 5 shows a side cross-sectional view 500 of the FIG. 4 structure following deposition of a sacrificial capping layer 502. The sacrificial capping layer 502 may be formed of SiN in some embodiments, although other suitable materials such as SiO$_2$ may be used in other embodiments. The sacrificial capping layer 502 may be deposited using ALD or CVD in some embodiments.

Figure 6:
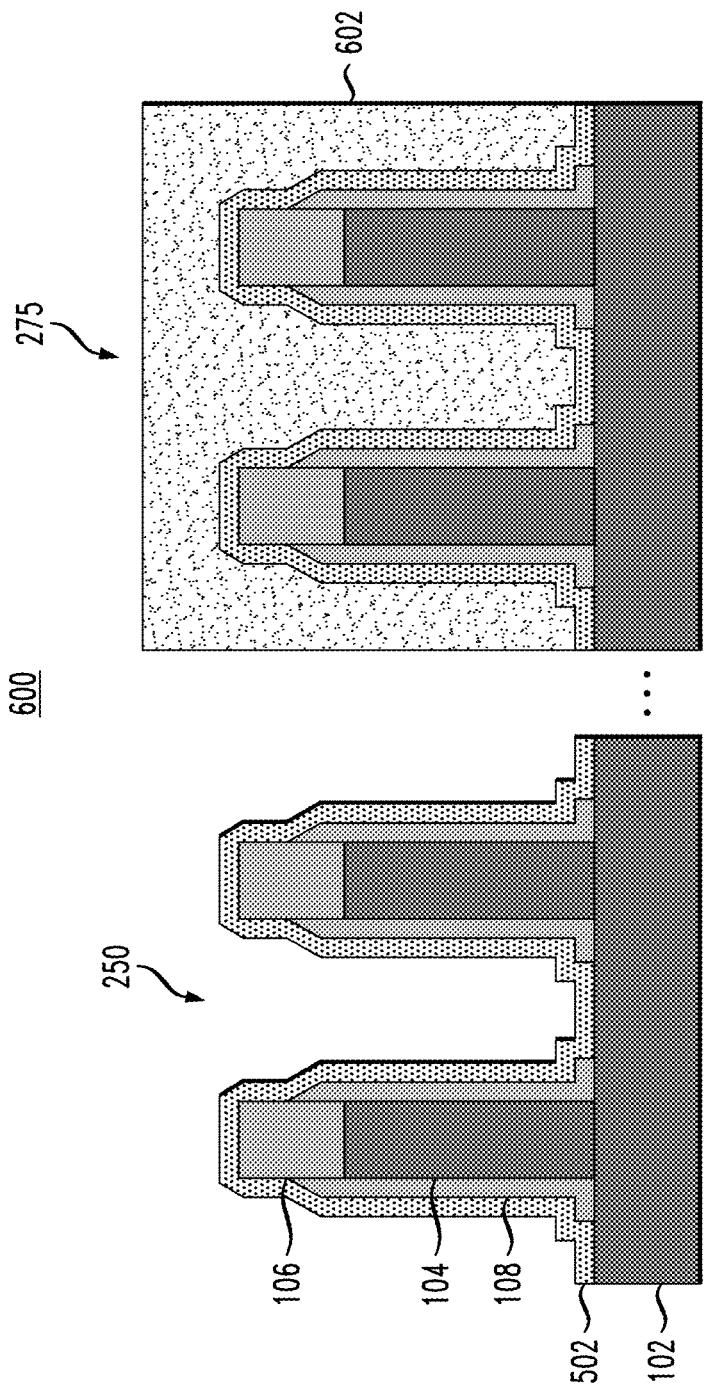
FIG. 6 depicts a side cross-sectional view of the FIG. 5 structure following blocking of a second portion of the structure, according to an embodiment of the present invention.

FIG. 6 shows a side cross-sectional view 600 of the FIG. 5 structure following blocking of the second portion or NFET region of the structure. Blocking the NFET region may be performed by depositing blocking layer 602 in the NFET region. In some embodiments, this involves depositing the blocking layer 602 over both the PFET and NFET regions followed by forming a mask over the NFET region and removing the blocking layer 602 from the PFET region. In some embodiments, the blocking layer 602 is an OPL or other resist block layer material, which may be patterned by lithography process and RIE. The resist block stack can be single, bilayer or trilayer depending on the lithography edge accuracy requirement. The blocking layer 602 in other embodiments may be amorphous carbon (a-C).

Figure 7:
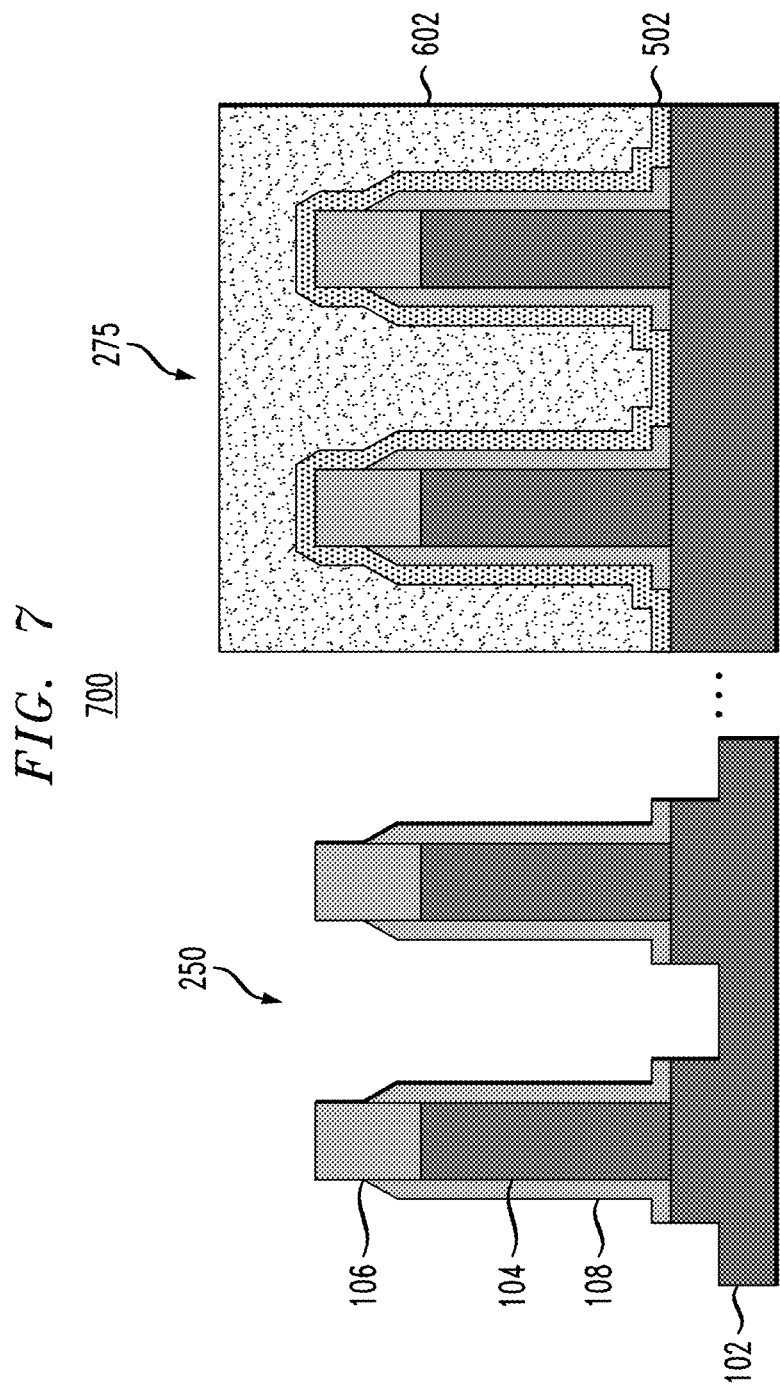
FIG. 7 depicts a side cross-sectional view of the FIG. 6 structure following etching of the sacrificial capping layer and fin recess in a first portion of the structure, according to an embodiment of the present invention.

FIG. 7 shows a side cross-sectional view 700 of the FIG. 6 structure following etching of the exposed sacrificial capping layer 502 in the PFET region and fin recess of the source/drain 102 in the PFET region. Etching of the exposed sacrificial capping layer 502 in the PFET region may be formed using SiN ME or wet etching in some embodiments. Recessing the source/drain 102 or fin may be performed by Si RIE etching. For a finFET device, the process of recessing the source/drain 102 may be referred to as fin recess. For a planar device, the process of recessing the source/drain 102 may be referred to as source/drain recess. It should be noted that performing the fin recess is an optional step. FIGS. 15-22, which will be described in detail below, illustrate processing without performing the fin recess shown in FIG. 7. In some embodiments, fin recess is preferred is preferred for most of the resulting structure, but is not necessary.

Figure 8:
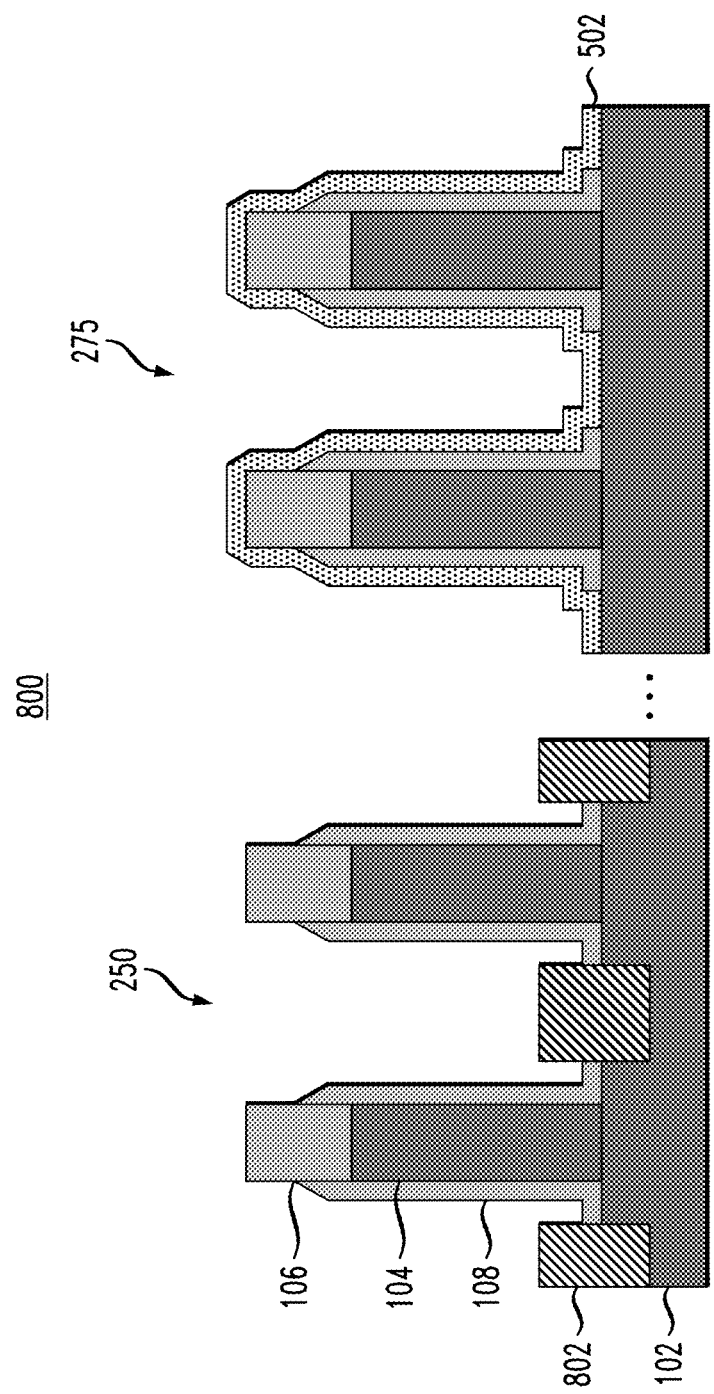
FIG. 8 depicts a side cross-sectional view of the FIG. 7 structure following stripping of the sacrificial blocking layer and epitaxial growth in the first portion of the structure, according to an embodiment of the present invention.

FIG. 8 shows a side cross-sectional view 800 of the FIG. 7 structure following removal of the blocking layer 602 from the NFET region of the structure and epitaxial growth in the PFET region of epitaxial layers 802. The blocking layer 602 may be removed using $O_{d2}$-based plasma ashing processes, or wet etching using chemistries such as a sulfuric acid-hydrogen peroxide mixture. In some embodiments, the epitaxial layers 802 are silicon germanium (SiGe), although other suitable materials may be used in other embodiments including but not limited to SiGe doped with one or more group III elements such as boron (B), aluminum (Al), gallium (Ga), indium (In), thallium (Tl), etc. The sacrificial capping layer 502 that remains in the NFET region of the structure protects and prevents epitaxial growth in the NFET region during the processing shown in FIG. 8. Advantageously, the L-shaped spacers 108 provide for uniform epitaxial growth, such as uniform epitaxial depth or height, of the epitaxial layers 802 between adjoining ones of the gates 104. The term uniform as used in the context of uniform epitaxial growth does not require the epitaxial growth to be exactly the same, but only within some threshold distance such that the epitaxial growth depth or height is substantially the same. For example, due to process variations the exact depth or height of the epitaxial growth may vary slightly, such as within 3 nm, but still be considered substantially the same or uniform.

Figure 9:
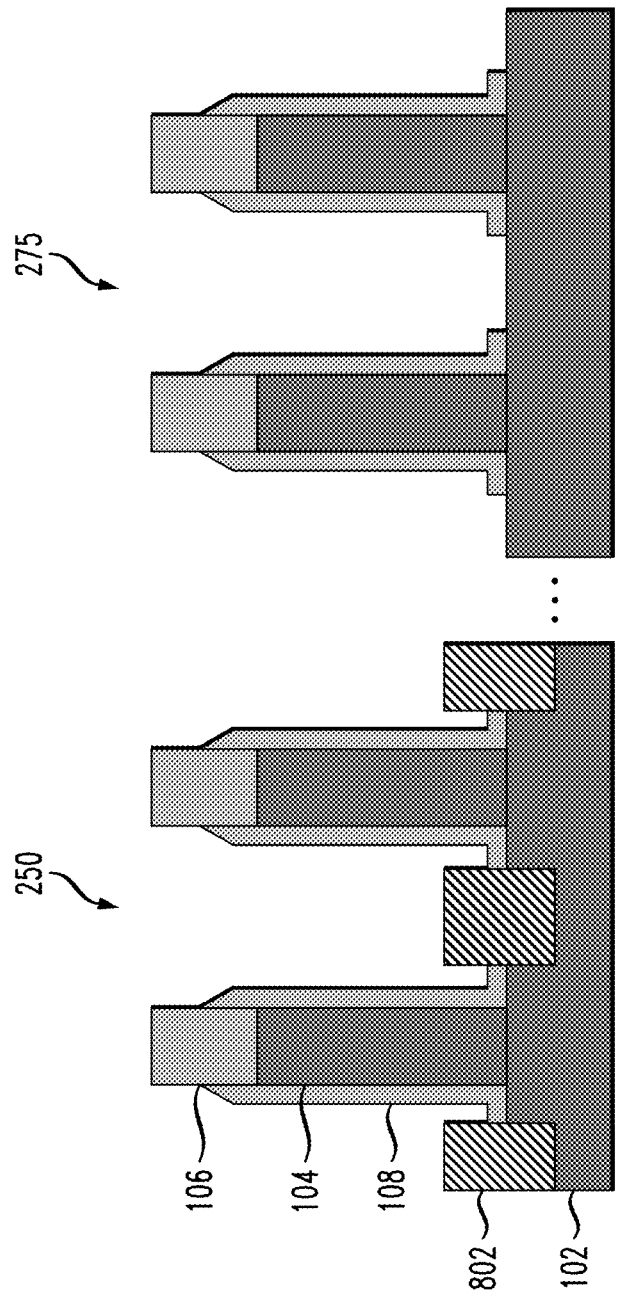
FIG. 9 depicts a side cross-sectional view of the FIG. 8 structure following stripping of the remaining sacrificial capping layer in the second portion of the structure, according to an embodiment of the present invention.

FIG. 9 shows a side cross-sectional view 900 of the FIG. 8 structure following stripping of the remaining sacrificial capping layer 502 from the NFET region. In some embodiments, HF-based wet chemistries can remove the SiN cap liner without attacking the SiBCN main spacer. Other techniques which may be used include but are not limited to plasma etching to remove SiN selective to SiBCN.

The processing described above with respect to PFET epitaxial growth in the PFET region may be repeated for NFET epitaxial growth in the NFET region as shown in FIGS. 10-14. Unless otherwise noted, similar processing steps are used for formation and removal of similar layers in FIGS. 10-14.

Figure 10:
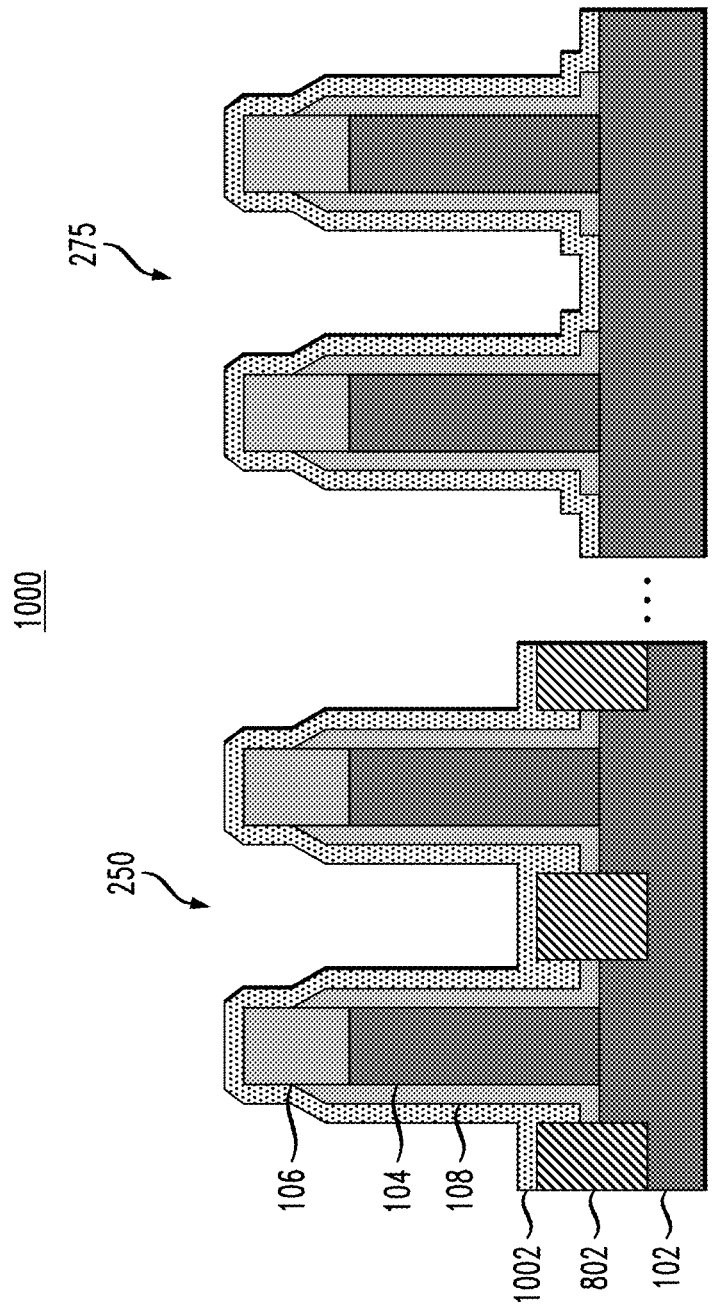
FIG. 10 depicts a side cross-sectional view of the FIG. 9 structure following deposition of a sacrificial capping layer, according to an embodiment of the present invention.

FIG. 10 shows a side cross-sectional view 1000 of the FIG. 9 structure following deposition of another sacrificial capping layer 1002 over the PFET and NFET regions of the structure.

Figure 11:
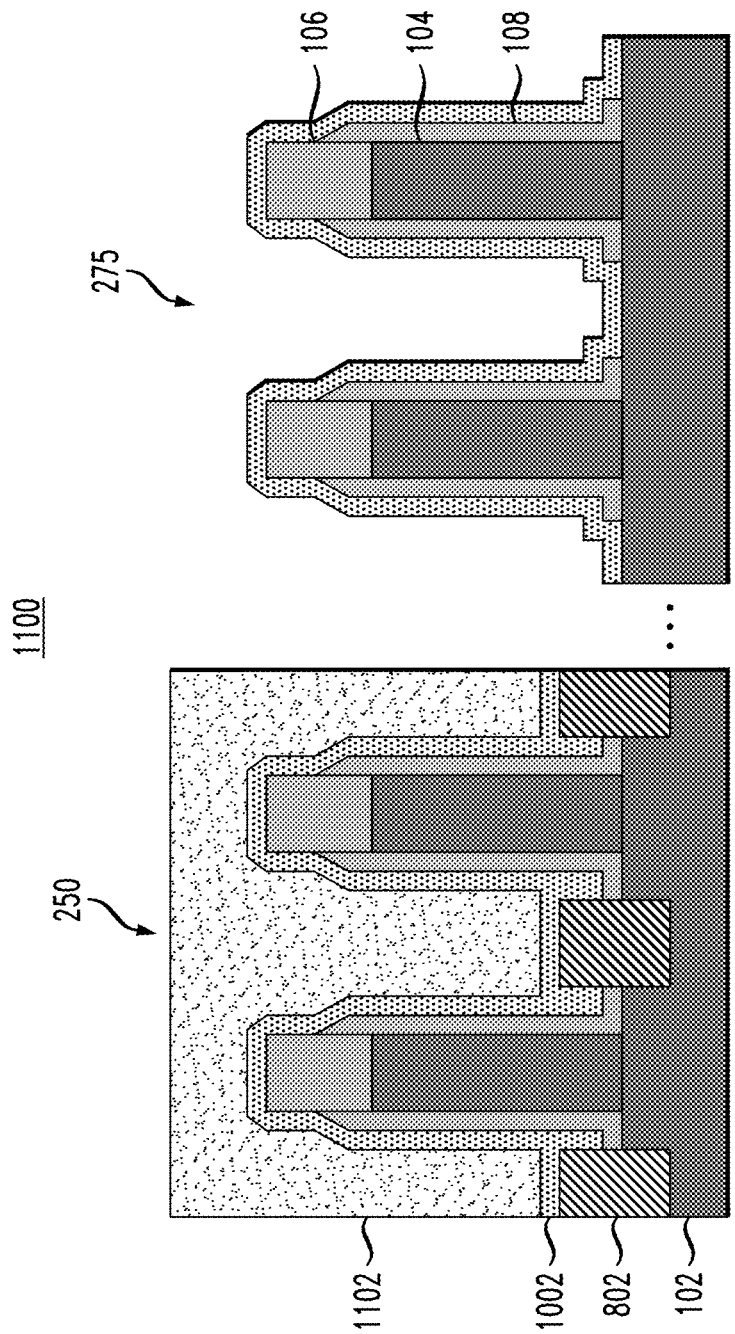
FIG. 11 depicts a side cross-sectional view of the FIG. 10 structure following blocking of the first portion of the structure, according to an embodiment of the present invention.

FIG. 11 shows a side cross-sectional view 1100 of the FIG. 10 structure following blocking of the first portion or PFET region of the structure by depositing blocking layer 1102 in the PFET region. The blocking layer 1102, similar to blocking layer 602, may be formed of an OPL or other suitable material.

Figure 12:
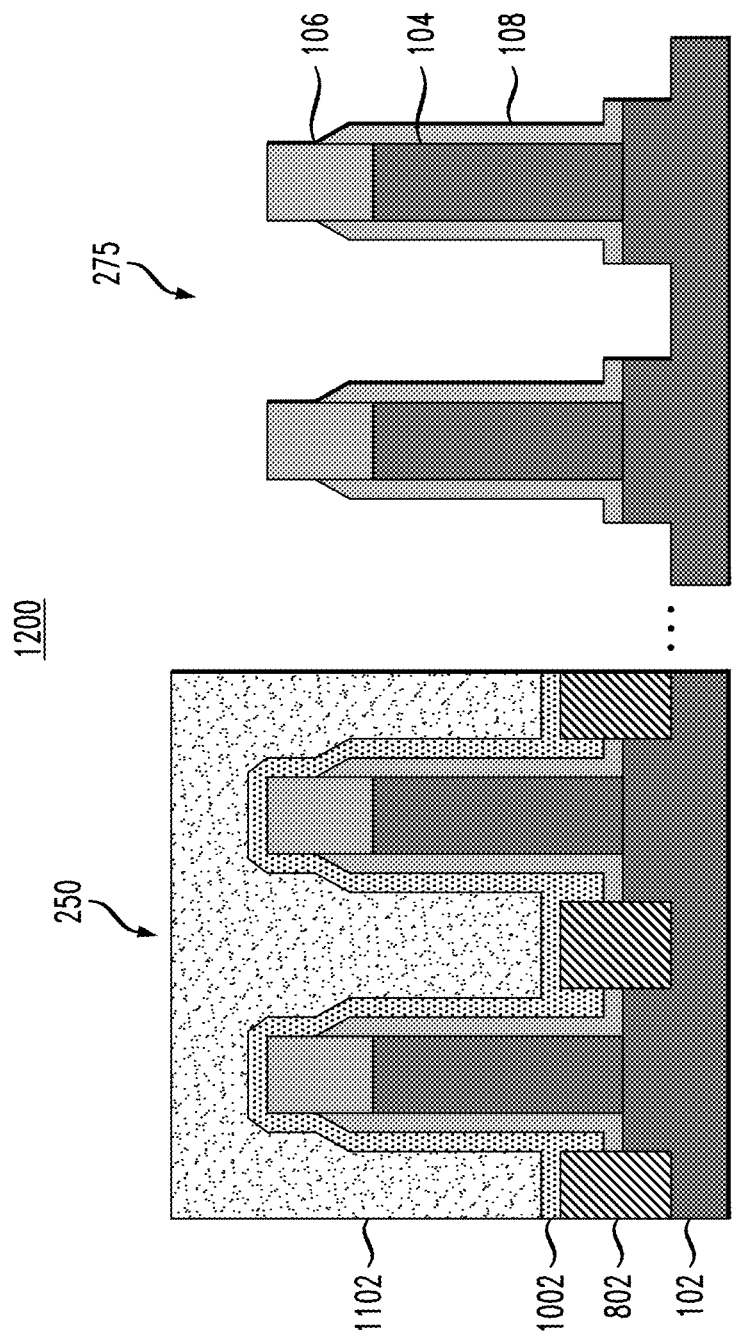
FIG. 12 depicts a side cross-sectional view of the FIG. 11 structure following etching and fin recess in the second portion of the structure, according to an embodiment of the present invention.

FIG. 12 shows a side cross-sectional view 1200 of the FIG. 11 structure following etching of the exposed sacrificial capping layer 1002 in the NFET region as well as fin recess of the source/drain 102 in the NFET region. As noted above with respect to FIG. 7, fin recess of the source/drain 102 is an optional step, and FIGS. 15-22 described below illustrate processing without performing the fin recess shown in FIG. 12.

Figure 13:
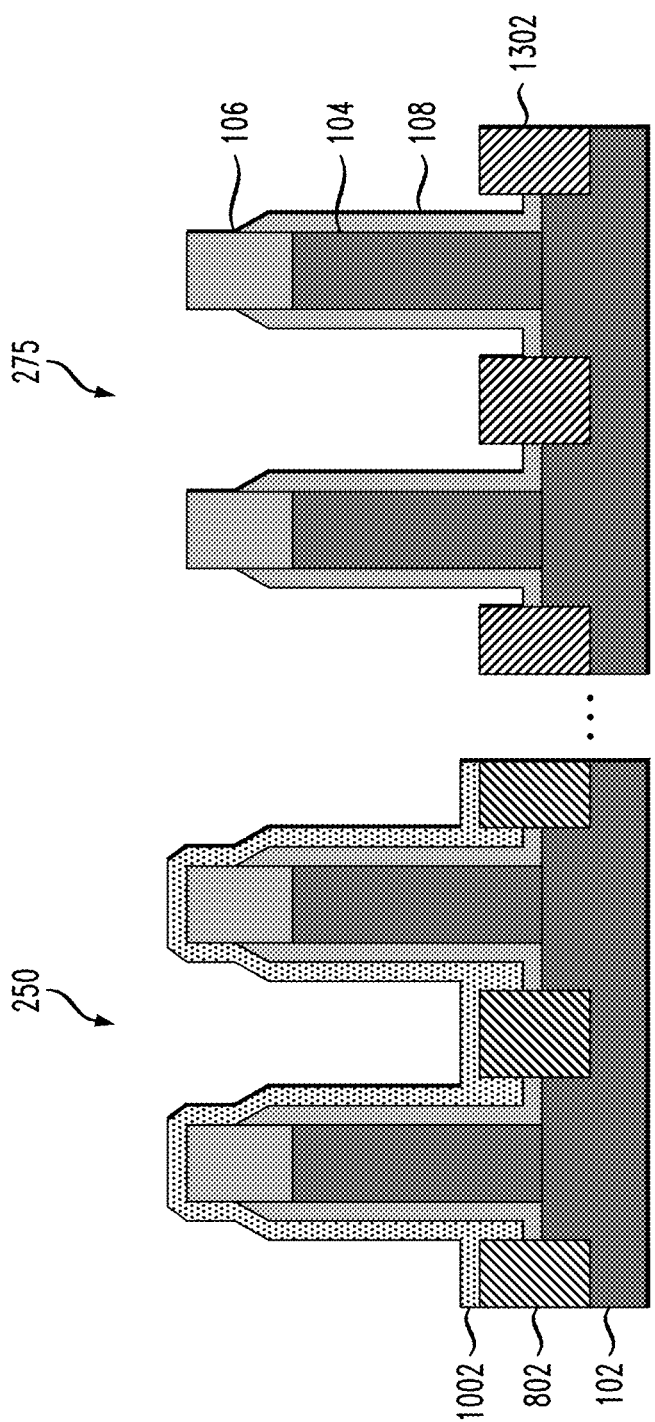
FIG. 13 depicts a side cross-sectional view of the FIG. 12 structure following stripping of the sacrificial blocking layer and epitaxial growth in the second portion of the structure, according to an embodiment of the present invention.

FIG. 13 shows a side cross-sectional view 1300 of the FIG. 12 structure following removal of the blocking layer 1102 from the PFET region of the structure and epitaxial growth in the NFET region of epitaxial layers 1302. In some embodiments, the epitaxial layers 1302 are SiP, although other suitable materials may be used in other embodiments including but not limited to SiP doped with C or other group V elements such as nitrogen (N), phosphorus (P), arsenic (As), antimony (Sb) and lead (Pb). Similar to the sacrificial capping layer 502 described above with respect to FIG. 8, the sacrificial capping layer 1002 that remains in the PFET region of the structure protects and prevents further epitaxial growth in the PFET region during the processing shown in FIG. 13. Advantageously, the L-shaped spacers 108 provide for uniform epitaxial growth of the epitaxial layers 1302 between adjoining ones of the gates 104.

Figure 14:
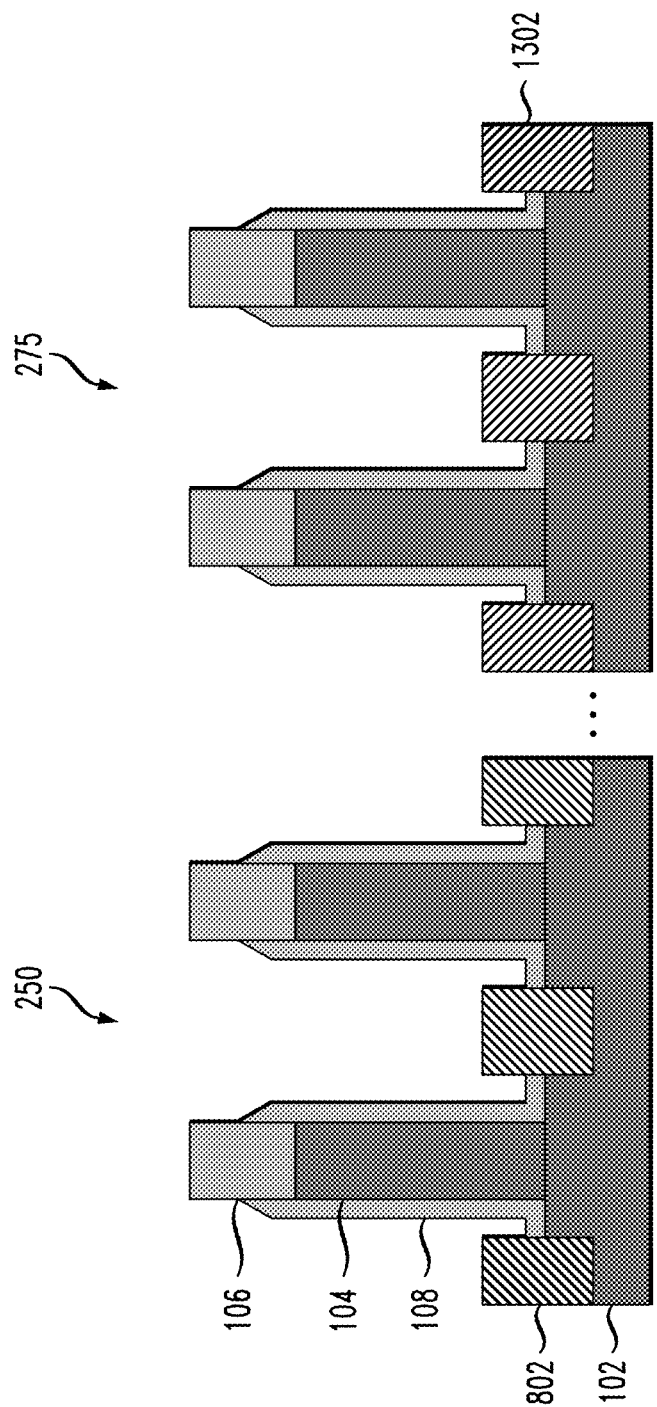
FIG. 14 depicts a side cross-sectional view of the FIG. 13 structure following stripping of the remaining sacrificial blocking layer in the first portion of the structure, according to an embodiment of the present invention.

FIG. 14 shows a side cross-sectional view 1400 of the FIG. 13 structure following stripping of the remaining sacrificial capping layer 1002 from the PFET region. Although not explicitly shown, a capping layer such as capping layer 110 may be formed over the structure shown in FIG. 14 as illustrated in FIG. 1.

FIGS. 15-22, as mentioned above, depict processing similar to that of FIGS. 7-14 but without fin recess in the PFET or NFET regions of the structure. It is to be appreciated, however, that while FIGS. 7-14 show fin recess in both the PFET and NFET regions of a structure and FIGS. 15-22 show no fin recess in the PFET or NFET regions of a structure, embodiments are not limited to these arrangements. In some embodiments, fin recess may be performed in one of the PFET or NFET region but not the other. In other embodiments, fin recess may be performed in only a portion of one or both of the PFET and NFET regions by selectively blocking portions of the PFET and NFET regions.

Figure 15:
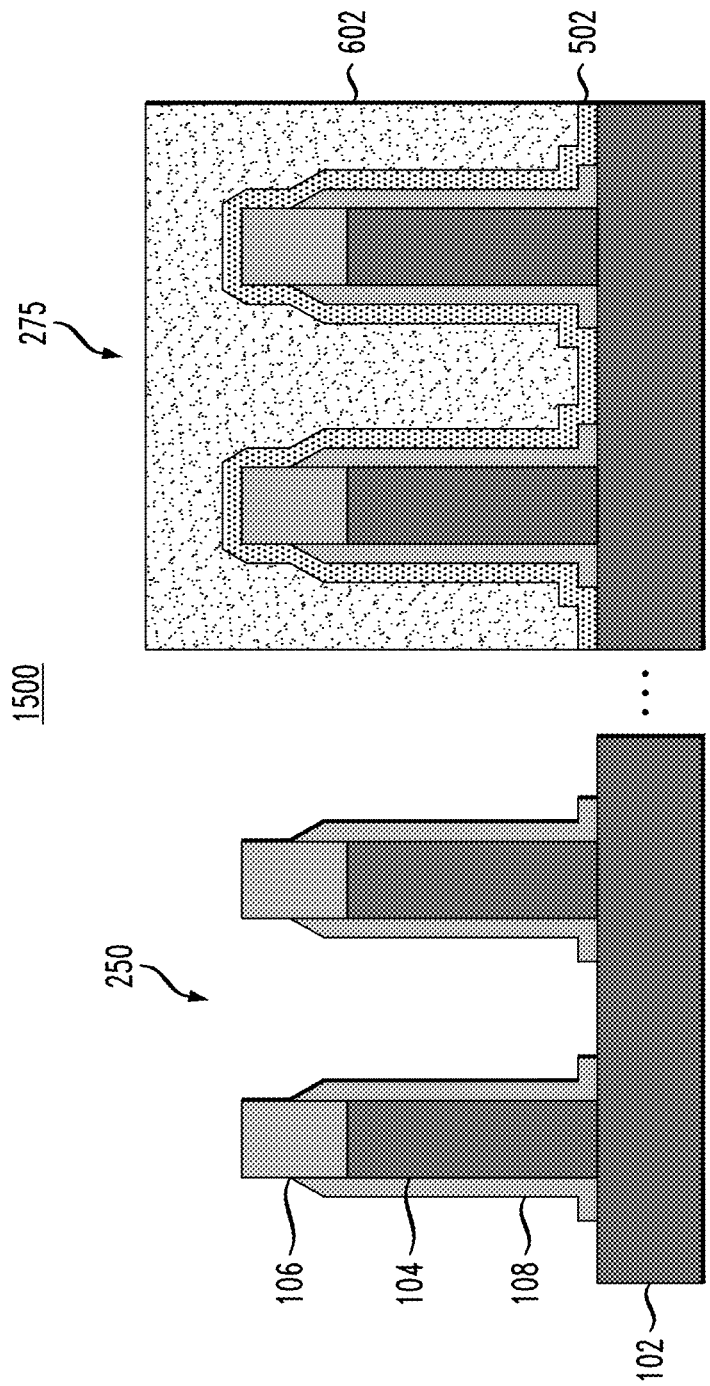
FIG. 15 depicts a side cross-sectional view of the FIG. 6 structure following etching without fin recess in the second portion of the structure, according to an embodiment of the present invention.

FIG. 15 shows a side cross-sectional view 1500 of the FIG. 6 structure following etching of the exposed sacrificial capping layer 502 in the PFET region without fin recess of source/drain 102. In some embodiments, fin recess is not preferred, such as in cases with structures such as those utilizing ETSOI (extremely thin silicon-on-insulator). In such structures, the source/drain Si is very thin, such as between 4-10 nm. If the Si is removed or recessed in such cases, the epi cannot grow since there would be no Si source/drain.

Figure 16:
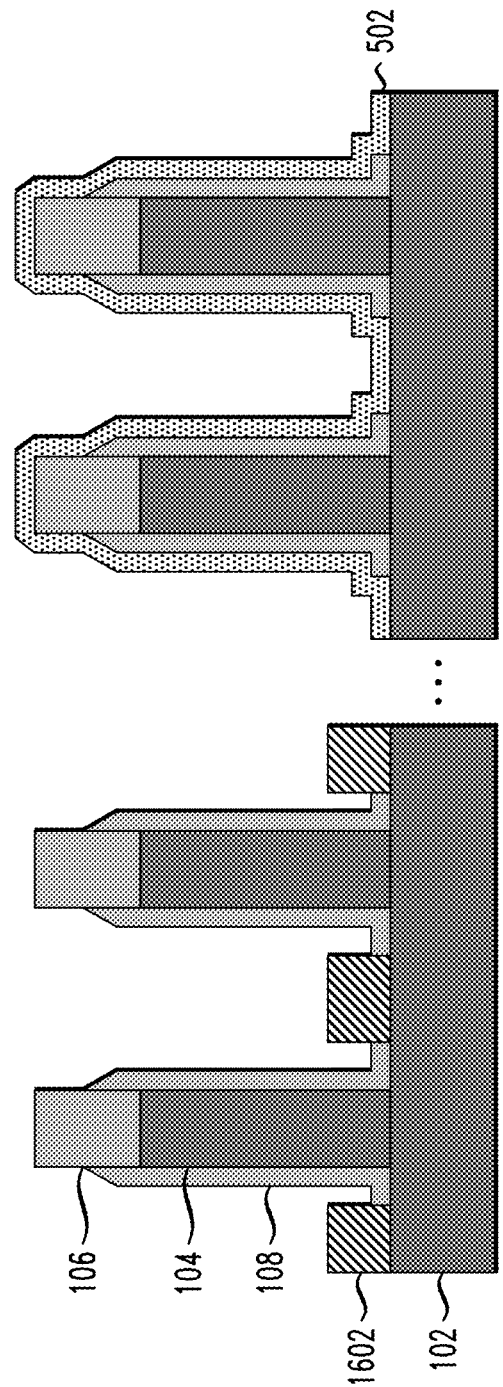
FIG. 16 depicts a side cross-sectional view of the FIG. 14 structure following stripping of the sacrificial blocking layer and epitaxial growth in the first portion of the structure, according to an embodiment of the present invention.

FIG. 16 shows a side cross-sectional view 1600 of the FIG. 15 structure following removal of the blocking layer 602 from the PFET region of the structure and epitaxial growth in the NFET region of epitaxial layers 1602. The epitaxial layers 1602 may be formed of materials similar to those of epitaxial layers 802 described above. The sacrificial capping layer 502 that remains in the NFET region of the structure protects and prevents epitaxial growth in the NFET region during the processing shown in FIG. 16. Advantageously, the L-shaped spacers 108 provide for uniform epitaxial growth of the epitaxial layers 1602 between adjoining ones of the gates 104.

Figure 17:
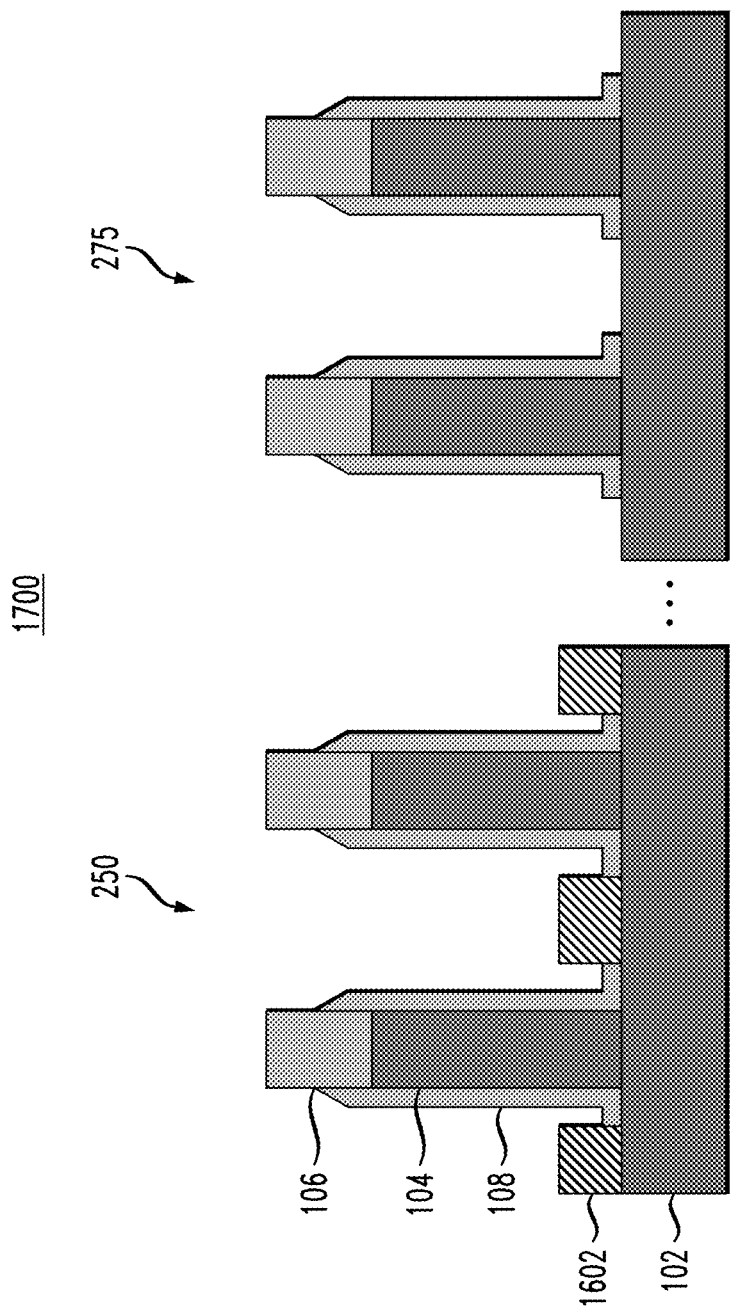
FIG. 17 depicts a side cross-sectional view of the FIG. 16 structure following stripping of the remaining sacrificial capping layer in the second portion of the structure, according to an embodiment of the present invention.

FIG. 17 shows a side cross-sectional view 1700 of the FIG. 16 structure following stripping of the remaining sacrificial capping layer 502 from the NFET region.

The processing described above with respect to PFET epitaxial growth in the PFET region may be repeated for NFET epitaxial growth in the NFET region as shown in FIGS. 18-22.

Figure 18:
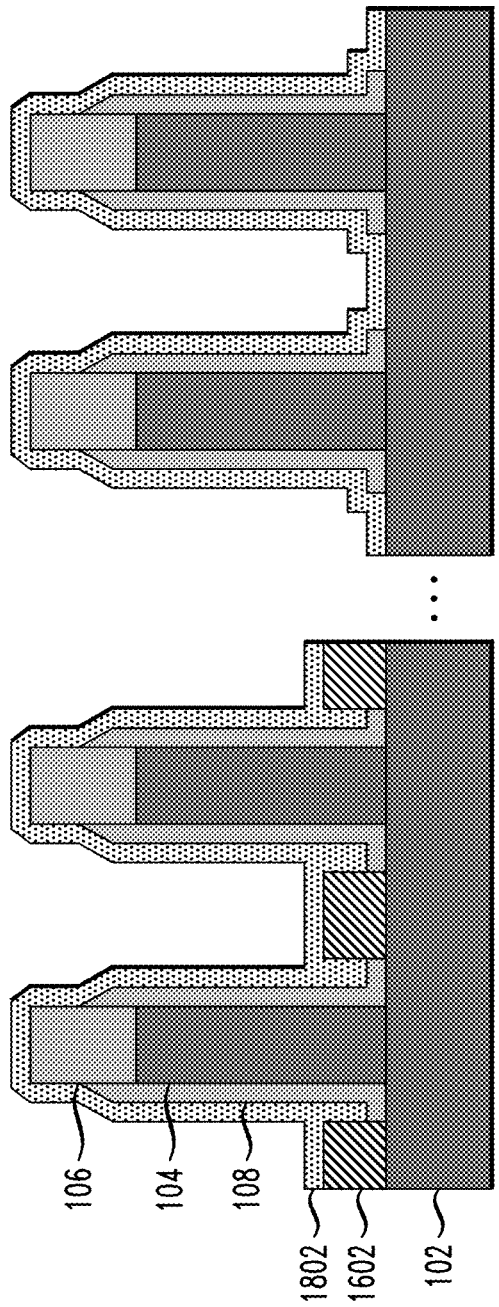
FIG. 18 depicts a side cross-sectional view of the FIG. 17 structure following deposition of a sacrificial capping layer, according to an embodiment of the present invention.

FIG. 18 shows a side cross-sectional view 1800 of the FIG. 17 structure following deposition of another sacrificial capping layer 1802 over the PFET and NFET regions of the structure.

Figure 19:
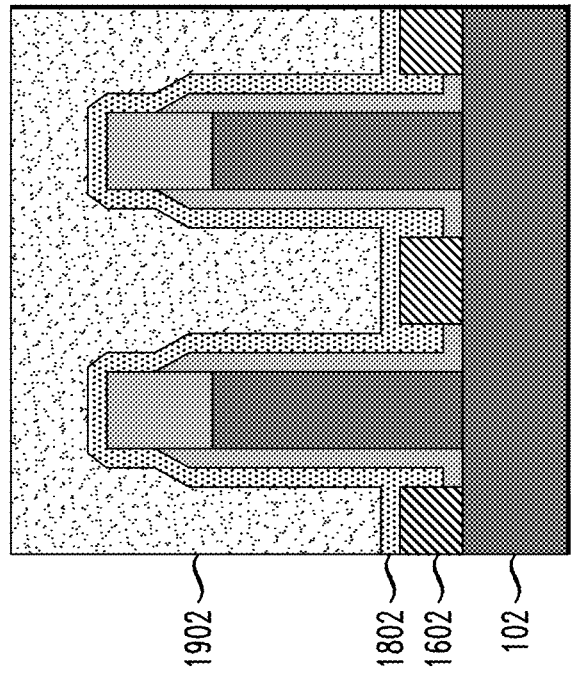
FIG. 19 depicts a side cross-sectional view of the FIG. 18 structure following blocking of the first portion of the structure, according to an embodiment of the present invention.

FIG. 19 shows a side cross-sectional view 1900 of the FIG. 18 structure following blocking of the first portion or PFET region of the structure by depositing blocking layer 1902 in the PFET region. The blocking layer 1902, similar to blocking layers 602 and 1102, may be formed of an OPL or other suitable material.

Figure 20:
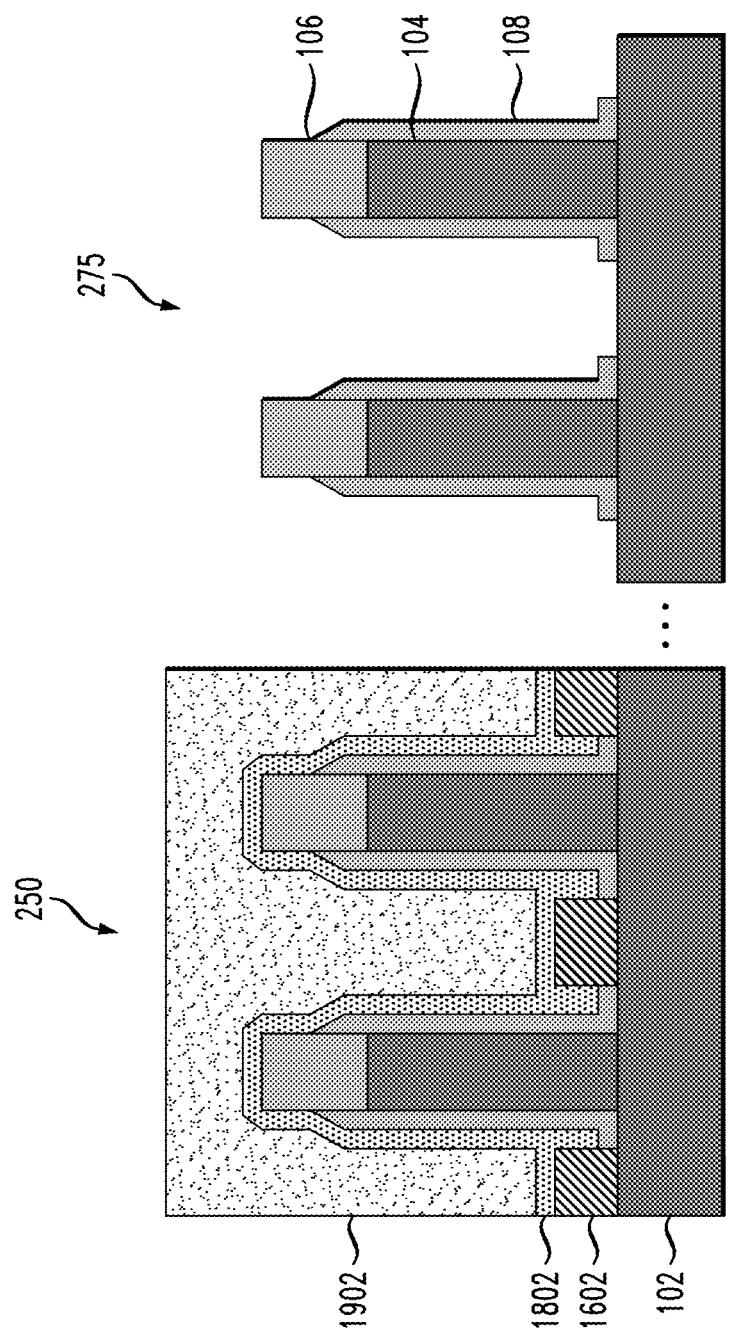
FIG. 20 depicts a side cross-sectional view of the FIG. 19 structure following etching of the sacrificial capping layer without fin recess in the second portion of the structure, according to an embodiment of the present invention.

FIG. 20 shows a side cross-sectional view 2000 of the FIG. 19 structure following etching of the exposed sacrificial capping layer 1802 in the NFET region without fin recess of the source/drain 102 in the NFET region.

Figure 21:
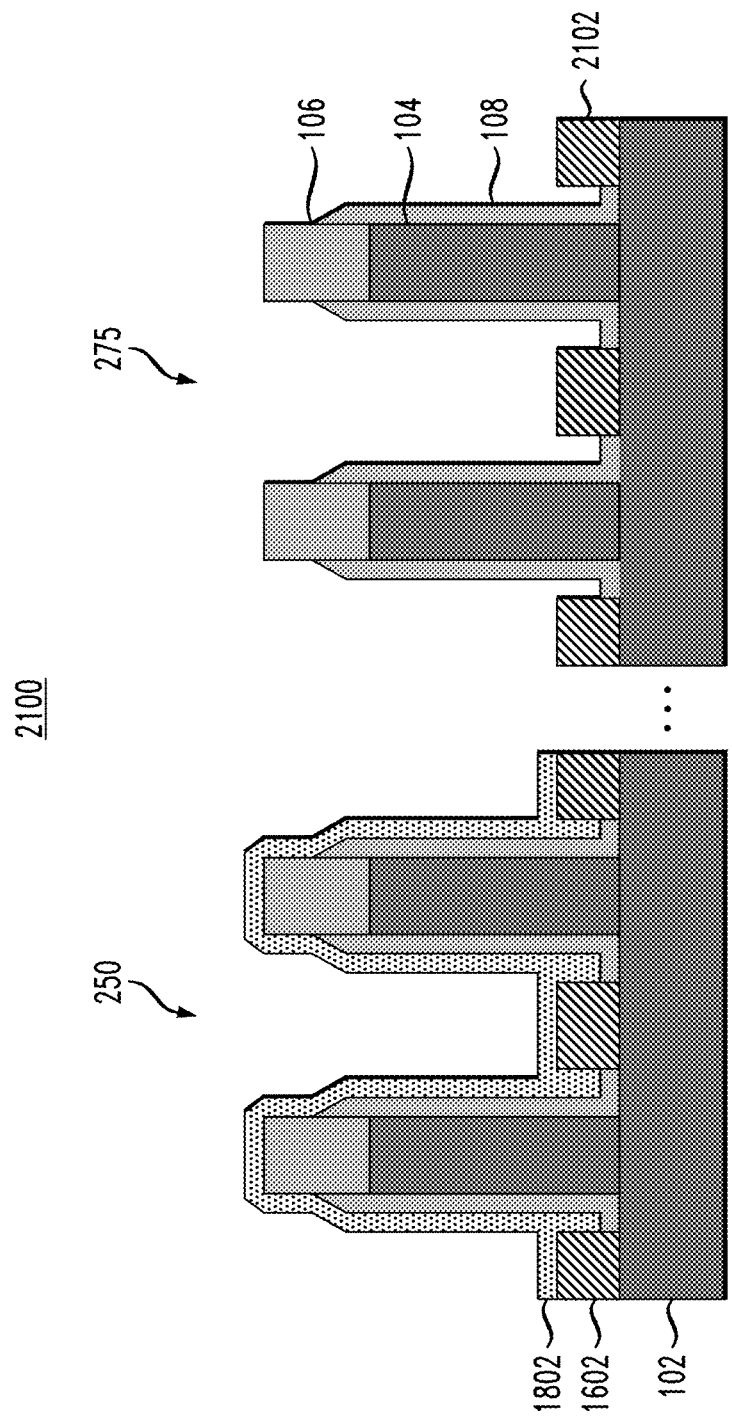
FIG. 21 depicts a side cross-sectional view of the FIG. 20 structure following stripping of the sacrificial blocking layer and epitaxial growth in the second portion of the structure, according to an embodiment of the present invention.

FIG. 21 shows a side cross-sectional view 2100 of the FIG. 20 structure following removal of the blocking layer 1902 from the PFET region of the structure and epitaxial growth in the NFET region of epitaxial layers 2102. The epitaxial layers 2102 may be formed of materials similar to those of epitaxial layers 1302 described above. Similar to the sacrificial capping layer 502 described above with respect to FIG. 16, the sacrificial capping layer 1802 that remains in the PFET region of the structure protects and prevents further epitaxial growth in the PFET region during the processing shown in FIG. 21. Advantageously, the L-shaped spacers 108 provide for uniform epitaxial growth of the epitaxial layers 2102 between adjoining ones of the gates 104.

Figure 22:
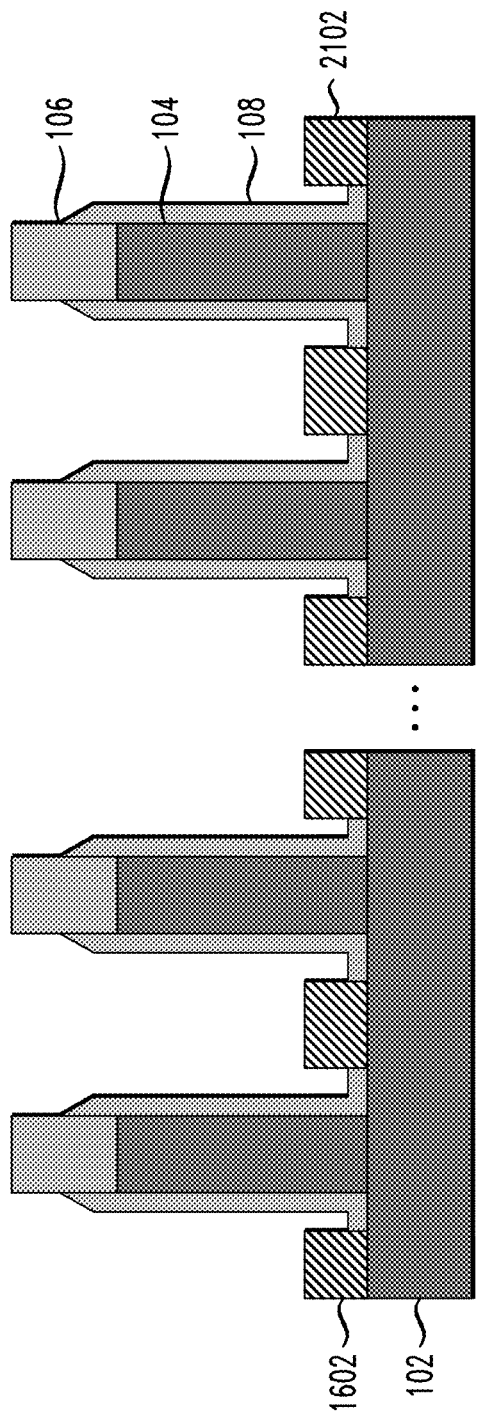
FIG. 22 depicts a side cross-sectional view of the FIG. 13 structure following stripping of the remaining sacrificial capping layer in the first portion of the structure, according to an embodiment of the present invention.

FIG. 22 shows a side cross-sectional view 2200 of the FIG. 21 structure following stripping of the remaining sacrificial capping layer 1802 from the PFET region. Although not explicitly shown, a capping layer such as capping layer 110 may be formed over the structure shown in FIG. 22 as illustrated in FIG. 1.

It is to be appreciated that although FIGS. 7-14 and 15-22 illustrate processes wherein epitaxial layers are grown in the PFET region before the NFET region, with and without fin recess, this is not a requirement. In other embodiments, epitaxial layers may be grown in the NFET region before the PFET region. In addition, although FIGS. 7-14 and 15-22 show example processes wherein there is one PFET region and one NFET region, this is not a requirement. The processes described may be used with any desired number of PFET and NFET regions.

In some embodiments, a method of forming a semiconductor structure comprises depositing a spacer material over a top surface of a substrate and two or more spaced-apart gates formed on the top surface of the substrate, depositing a sacrificial liner over the spacer material, etching the sacrificial liner and the spacer material to expose portions of the top surface of the substrate between the two or more spaced-apart gates, and removing the sacrificial liner such that remaining spacer material forms two or more spacers between the two or more spaced-apart gates, each of the spacers comprising a first portion proximate the top surface of the substrate having a first width and a second portion above the first portion with a second width smaller than the first width. The substrate may be a source/drain region.

In some embodiments, a first distance between the first portions of pairs of spacers between adjoining pairs of the spaced-apart gates is less than a second distance between the second portions of the pairs of spacers between the adjoining pairs of the spaced-apart gates. In some embodiments, the First distance and the second distance is substantially the same for each pair of spacers. The spacer material may comprise SiBCN and the sacrificial liner may comprise one of SiN and an oxide. A distance between at least one adjoining pair of the spaced-apart gates is less than 50 nm in some embodiments.

In some embodiments, the method further comprises depositing a first sacrificial capping layer over the spacers and the top surface of the substrate, forming a first blocking layer over the sacrificial capping layer, forming a first mask over a first portion of the first blocking layer to define a first region of the semiconductor structure left exposed by the first mask and a second region of the semiconductor structure covered by the first mask, and removing the first blocking layer over the first region of the semiconductor structure left exposed by the first mask to expose a portion of the first sacrificial capping layer formed over at least two adjoining spacers and the top surface of the substrate between said at least two adjoining spacers in the first region of the semiconductor structure. The first sacrificial capping layer may comprise SiN and the first blocking layer may comprise an OPL.

The method may further include removing the exposed portion of the first sacrificial capping layer. In some embodiments, the surface of the substrate is recessed between said at least two adjoining spacers exposed by removal of the exposed portion of the first sacrificial capping layer. In such embodiments, the method may further comprise removing the first blocking layer formed over the second region of the semiconductor structure, growing first epitaxial layers over the recessed portions of the top surface of the substrate between said at least two adjoining spacers exposed by removal of the exposed portion of the first sacrificial capping layer in the first region of the semiconductor structure, and removing a remaining portion of the first sacrificial capping layer. The first epitaxial layers may comprise one of PFET and NFET source/drain epitaxial layers.

In embodiments wherein the top surface of the substrate is recessed between said at least two adjoining spacers exposed by removal of the exposed portion of the first sacrificial capping layer, the method may further comprise depositing a second sacrificial capping layer over the spacers and the top surface of the substrate, forming a second blocking layer over the second sacrificial capping layer, forming a second mask over a first portion of the second blocking layer, the first portion of the second blocking layer covering the first region of the semiconductor structure and exposing the second region of the semiconductor structure, removing the second blocking layer over the second region of the semiconductor structure left exposed by the second mask to expose a portion of the second sacrificial capping layer formed over at least two adjoining spacers and the top surface of the substrate between said at least two adjoining spacers in the second region of the semiconductor structure, removing the exposed portion of the second sacrificial capping layer, recessing the top surface of the substrate between said at least two adjoining spacers exposed by removal of the exposed portion of the second sacrificial capping layer, removing the second blocking layer formed over the first region of the semiconductor structure, growing second epitaxial layers over the recessed portions of the top surface of the substrate between said at least two adjoining spacers exposed by removal of the exposed portion of the second sacrificial capping layer in the second region of the semiconductor structure, and removing a remaining portion of the second sacrificial capping layer. The first region of the semiconductor structure may comprise one of a PFET region and an NFET region and the second region of the semiconductor structure may comprise the other one of the PFET region and the NFET region. The first epitaxial layers may comprise PFET epitaxial layers while the second epitaxial layers comprise NFET epitaxial layers.

In some embodiments, the surface of the substrate is not recessed between said at least two adjoining spacers exposed by removal of the exposed portion of the first sacrificial capping layer. In such embodiments, the method may further include removing the first blocking layer formed over the second region of the semiconductor structure, growing first epitaxial layers over portions of the top surface of the substrate between said at least two adjoining spacers exposed by removal of the exposed portion of the first sacrificial capping layer in the first region of the semiconductor structure, and removing a remaining portion of the first sacrificial capping layer.

In embodiments wherein the surface of the substrate is not recessed, the method may further comprise depositing a second sacrificial capping layer over the spacers and the top surface of the substrate, forming a second blocking layer over the second sacrificial capping layer;, forming a second mask over a first portion of the second blocking layer, the first portion of the second blocking layer covering the first region of the semiconductor structure and exposing the second region of the semiconductor structure, removing the second blocking layer over the second region of the semiconductor structure left exposed by the second mask to expose a portion of the second sacrificial capping layer formed over at least two adjoining spacers and the top surface of the substrate between said at least two adjoining spacers in the second region of the semiconductor structure, removing the exposed portion of the second sacrificial capping layer, removing the second blocking layer formed over the first region of the semiconductor structure, growing second epitaxial layers over portions of the top surface of the substrate between said at least two adjoining spacers exposed by removal of the exposed portion of the second sacrificial capping layer in the second region of the semiconductor structure, and removing a remaining portion of the second sacrificial capping layer.

In some embodiments, a semiconductor structure comprises a finFET structure comprising two or more spaced-apart gates formed on a fin substrate and two or more spacers formed between the two or more spaced-apart gates, wherein each of the spacers comprises a first portion proximate a top surface of the fin substrate having a first width and a second portion above the first portion with a second width smaller than the first width. A first distance between the first portions of pairs of spacers between adjoining pairs of the spaced-apart gates and a second distance between the second portions of the pairs of spacers between the adjoining pairs of the spaced-apart gates are substantially the same for each pair of spacers. A distance between at least one adjoining pair of the two or more spaced-apart gates, or the gate pitch, is less than 50 nm in some embodiments. The semiconductor structure may further comprise epitaxial layers grown in a first region of the finFET structure over the top surface of the fin substrate between at least two adjoining spacers surrounding at least one adjoining pair of the spaced-apart gates, where each of the epitaxial layers having a substantially uniform height relative to the top surface of the fin substrate.

In some embodiments, an integrated circuit comprises a finFET structure comprising two or more spaced-apart gates formed on a fin substrate and two or more spacers formed between the two or more spaced-apart gates, wherein each of the spacers comprises a first portion proximate a top surface of the fin substrate having a first width and a second portion above the first portion with a second width smaller than the first width. A first distance between the first portions of pairs of spacers between adjoining pairs of the spaced-apart gates and a second distance between the second portions of the pairs of spacers between the adjoining pairs of the spaced-apart gates are substantially the same for each pair of spacers.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOSs), metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a fin field-effect transistor (finFET) structure, comprising:
   depositing a spacer material over a top surface of a fin substrate and two or more spaced-apart gates formed on the top surface of the fin substrate;
   depositing a sacrificial liner over the spacer material;
   etching the sacrificial liner and the spacer material to expose portions of the top surface of the fin substrate between the two or more spaced-apart gates;
   removing the sacrificial liner such that remaining spacer material forms two or more spacers between the two or more spaced-apart gates, each of the spacers comprising a first portion proximate the top surface of the fin substrate having a first width and a second portion above the first portion with a second width smaller than the first width;
   wherein the two or more spaced-apart gates comprise at least a first adjoining pair of spaced-apart gates for at least a first pair of negative channel field-effect transistors (NFETs) and at least a second adjoining pair of spaced-apart gates for at least a second pair of positive channel field-effect transistors (PFETs); and
   wherein the second portions of the spacers surrounding the first adjoining pair of spaced-apart gates and the second portions of the spacers surrounding the second adjoining pair of spaced-apart gates each have substantially the same first width.

2. The method of claim 1, wherein a first distance between the first portions of pairs of spacers between the first and second adjoining pairs of the spaced-apart gates is less than a second distance between the second portions of the pairs of spacers between the first and second adjoining pairs of the spaced-apart gates.

3. The method of claim 1, wherein the first distance and the second distance is substantially the same for the pairs of spacers surrounding the first adjoining pair of spaced-apart gates and the pairs of spacers surrounding the second adjoining pair of spaced apart gates.

4. The method of claim 1, wherein the spacer material comprises silicon boron carbon nitride (SiBCN) and the sacrificial liner comprises one of silicon nitride (SiN) and an oxide.

5. The method of claim 1, wherein a distance between at least one adjoining pair of the spaced-apart gates is less than 50 nanometers (nm).

6. The method of claim 1, further comprising:
   depositing a first sacrificial capping layer over the spacers and the top surface of the fin substrate;
   forming a first blocking layer over the sacrificial capping layer;
   forming a first mask over a first portion of the first blocking layer to define a first masking region of the finFET structure left exposed by the first mask and a second masking region of the finFET structure covered by the first mask; and
   removing the first blocking layer over the first masking region of the finFET structure left exposed by the first mask to expose a portion of the first sacrificial capping layer formed over at least two adjoining spacers and the top surface of the fin substrate between said at least two adjoining spacers in the first masking region of the finFET structure.

7. The method of claim 6, wherein the first sacrificial capping layer comprises silicon nitride (SiN) and the first blocking layer comprises an organic polymer layer (OPL).

8. The method of claim 6, further comprising removing the exposed portion of the first sacrificial capping layer.

9. The method of claim 8, further comprising recessing the top surface of the fin substrate between said at least two adjoining spacers exposed by removal of the exposed portion of the first sacrificial capping layer.

10. The method of claim 9, further comprising:
   removing the first blocking layer formed over the second masking region of the finFET structure;
   growing first ones of the epitaxial layers over the recessed portions of the top surface of the fin substrate between said at least two adjoining spacers exposed by removal of the exposed portion of the first sacrificial capping layer in the first masking region of the finFET structure; and
   removing a remaining portion of the first sacrificial capping layer.

11. The method of claim 10, wherein the first epitaxial layers comprises one of PFET epitaxial layers and NFET epitaxial layers.

12. The method of claim 10, further comprising:
   depositing a second sacrificial capping layer over the spacers and the top surface of the fin substrate;
   forming a second blocking layer over the second sacrificial capping layer;
   forming a second mask over a first portion of the second blocking layer, the first portion of the second blocking layer covering the first masking region of the finFET structure and exposing the second masking region of the finFET structure;
   removing the second blocking layer over the second masking region of the finFET structure left exposed by the second mask to expose a portion of the second sacrificial capping layer formed over at least two adjoining spacers and the top surface of the fin substrate between said at least two adjoining spacers in the second masking region of the finFET structure;
   removing the exposed portion of the second sacrificial capping layer;
   recessing the top surface of the fin substrate between said at least two adjoining spacers exposed by removal of the exposed portion of the second sacrificial capping layer;
   removing the second blocking layer formed over the first masking region of the finFET structure;
   growing second ones of the epitaxial layers over the recessed portions of the top surface of the fin substrate between said at least two adjoining spacers exposed by removal of the exposed portion of the second sacrificial capping layer in the second masking region of the finFET structure; and
   removing a remaining portion of the second sacrificial capping layer.

13. The method of claim 12, wherein the first masking region of the finFET structure comprises one of a PFET region and an NFET region, and the second masking region of the finFET structure comprises the other one of the PFET region and the NFET region.

14. The method of claim 12, wherein the first epitaxial layers comprises one of PFET epitaxial layers and NFET epitaxial layers and the second epitaxial layers comprise the other one of PFET epitaxial layers and NFET epitaxial layers.

15. The method of claim 8, further comprising:
removing the first blocking layer formed over the second masking region of the finFET structure;
growing first ones of the epitaxial layers over portions of the top surface of the fin substrate between said at least two adjoining spacers exposed by removal of the exposed portion of the first sacrificial capping layer in the first masking region of the finFET structure; and
removing a remaining portion of the first sacrificial capping layer.

16. The method of claim 15, further comprising:
depositing a second sacrificial capping layer over the spacers and the top surface of the fin substrate;
forming a second blocking layer over the second sacrificial capping layer;
forming a second mask over a first portion of the second blocking layer, the first portion of the second blocking layer covering the first masking region of the finFET structure and exposing the second masking region of the finFET structure;
removing the second blocking layer over the second masking region of the finFET structure left exposed by the second mask to expose a portion of the second sacrificial capping layer formed over at least two adjoining spacers and the top surface of the fin substrate between said at least two adjoining spacers in the second masking region of the finFET structure;
removing the exposed portion of the second sacrificial capping layer;
removing the second blocking layer formed over the first masking region of the finFET structure;
growing second epitaxial layers over portions of the top surface of the fin substrate between said at least two adjoining spacers exposed by removal of the exposed portion of the second sacrificial capping layer in the second masking region of the finFET structure; and
removing a remaining portion of the second sacrificial capping layer.

17. A semiconductor structure, comprising:
a fin field-effect transistor (finFET) structure comprising:
two or more spaced-apart gates formed on a fin substrate; and
two or more spacers formed between the two or more spaced-apart gates, wherein each of the spacers comprises a first portion proximate a top surface of the fin substrate having a first width and a second portion above the first portion with a second width smaller than the first width;
wherein a first distance between the first portions of pairs of spacers between adjoining pairs of the spaced-apart gates and a second distance between the second portions of the pairs of spacers between the adjoining pairs of the spaced-apart gates are substantially the same for each pair of spacers;
wherein the two or more spaced-apart gates comprise at least a first adjoining pair of spaced-apart gates for at least a first pair of negative channel field-effect transistors (NFETs) and at least a second adjoining pair of spaced-apart gates for at least a second pair of positive channel field-effect transistors (PFETs); and
wherein the second portions of the spacers surrounding the first adjoining pair of spaced-apart gates and the second portions of the spacers surrounding the second adjoining pair of spaced-apart gates each have substantially the same first width.

18. The semiconductor structure of claim 17, wherein a distance between at least one adjoining pair of the two or more spaced-apart gates is less than 50 nanometers (nm).

19. An integrated circuit comprising:
a fin field-effect transistor (finFET) structure comprising:
two or more spaced-apart gates formed on a fin substrate; and
two or more spacers formed between the two or more spaced-apart gates, wherein each of the spacers comprises a first portion proximate a top surface of the fin substrate having a first width and a second portion above the first portion with a second width smaller than the first width;
wherein a first distance between the first portions of pairs of spacers between adjoining pairs of the spaced-apart gates and a second distance between the second portions of the pairs of spacers between the adjoining pairs of the spaced-apart gates are substantially the same for each pair of spacers;
wherein the two or more spaced-apart gates comprise at least a first adjoining pair of spaced-apart gates for at least a first pair of negative channel field-effect transistors (NFETs) and at least a second adjoining pair of spaced-apart gates for at least a second pair of positive channel field-effect transistors (PFETs), and
wherein the second portions of the spacers surrounding the first adjoining pair of spaced-apart gates and the second portions of the spacers surrounding the second adjoining pair of spaced-apart gates each have substantially the same first width.

20. The semiconductor structure of claim 17, further comprising epitaxial layers grown in a first region of the finFET structure over the top surface of the fin substrate between at least two adjoining spacers surrounding at least one adjoining pair of the spaced-apart gates, each of the epitaxial layers having a substantially uniform height relative to the top surface of the fin substrate.

* * * * *